(12) United States Patent
Yaegashi et al.

(10) Patent No.: US 7,652,377 B2
(45) Date of Patent: Jan. 26, 2010

(54) SEMICONDUCTOR DEVICE AND MANUFACTURING METHOD OF THE SAME

(75) Inventors: Tetsuo Yaegashi, Kawasaki (JP); Kouichi Nagai, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/522,440

(22) Filed: Sep. 18, 2006

(65) Prior Publication Data
US 2007/0012976 A1    Jan. 18, 2007

Related U.S. Application Data

(63) Continuation of application No. PCT/JP2004/007373, filed on May 28, 2004.

(51) Int. Cl.
*H01L 23/52*   (2006.01)
*H01L 29/76*   (2006.01)

(52) U.S. Cl. .................. 257/758; 257/310; 257/409; 257/E27.086; 257/E29.013; 438/239; 438/240; 349/153

(58) Field of Classification Search .......... 257/295, 257/632, 639, 646, 651, 303, 306, 409, 758, 257/E27.086, E29.013; 365/145; 438/239, 438/240; 349/159
See application file for complete search history.

(56) References Cited

U.S. PATENT DOCUMENTS 5,349,366 A * 9/1994 Yamazaki et al. ............. 345/92

5,578,867 A * 11/1996 Argos et al. .................. 257/632
6,501,112 B1   12/2002 Sashida
6,741,316 B2 * 5/2004 Park et al. .................... 349/153

(Continued)

FOREIGN PATENT DOCUMENTS

JP    2000-277465 A    10/2000

(Continued)

OTHER PUBLICATIONS

Tanaka Yoshinori, JP2002-134506, English translation, May 2002.*
International Search Report of PCT/JP2004/007373 date of mailing Aug. 31, 2004.

(Continued)

*Primary Examiner*—Dao H Nguyen
(74) *Attorney, Agent, or Firm*—Westerman, Hattori, Daniels & Adrian, LLP

(57) ABSTRACT

A seal ring (102) is formed in a manner to surround each ferroelectric capacitor (101). Additionally, a seal ring (103) is formed in a manner to surround a plurality of ferroelectric capacitors (101). Further, a seal ring (104) is formed in a manner to surround all of the ferroelectric capacitors (101) and along a dicing line (110) inside the dicing line (110).

19 Claims, 9 Drawing Sheets

U.S. PATENT DOCUMENTS

| | | |
|---|---|---|
| 7,176,132 B2 | 2/2007 | Sashida et al. |
| 7,348,623 B2 * | 3/2008 | Akiyama .................... 257/303 |
| 2005/0127395 A1 * | 6/2005 | Saigoh et al. .............. 257/127 |

FOREIGN PATENT DOCUMENTS

| | | |
|---|---|---|
| JP | 2002-026286 A | 1/2002 |
| JP | 2002-262286 A | 1/2002 |
| JP | 2002-134506 A | 5/2002 |
| JP | 2004-153031 A | 5/2004 |
| JP | 2005-175204 A | 6/2005 |
| KR | 2004-38861 A | 5/2004 |

OTHER PUBLICATIONS

Translation of the International Preliminary Report on Patentability of International Application No. PCT/JP2004/007373, with Form PCT/IB/373 and Form PCT/ISA/237, dated Dec. 7, 2006.

Korean Office Action dated Dec. 28, 2007, issued in corresponding Korean patent application No. 10-2006-7018429.

Chinese Office Action dated Mar. 7, 2008, issued in corresponding Chinese patent application No. 200480042436.1.

* cited by examiner

SEMICONDUCTOR DEVICE AND MANUFACTURING METHOD OF THE SAME

TECHNICAL FIELD

The present invention relates to a semiconductor device suitable for a nonvolatile memory having a ferroelectric capacitor and a manufacturing method of the same.

BACKGROUND ART

Conventionally, in a semiconductor device such as a memory, a seal ring (moisture-proof ring) is formed along a dicing line as described in Patent Document 1 (Japanese Patent Application Laid-open No. 2000-277465), for example. Such a seal ring is formed in order to prevent permeation of moisture from the outside.

However, in a ferroelectric memory being a memory having a ferroelectric capacitor, it is difficult to sufficiently prevent deterioration of the ferroelectric capacitor due to moisture absorption only by such a seal ring.

Patent Document 1: Japanese Patent Application Laid-open No. 2000-277465

SUMMARY OF THE INVENTION

An object of the present invention is to provide a semiconductor device capable of restraining deterioration of a ferroelectric capacitor due to moisture absorption and a manufacturing method of the same.

As a result of keen examination to solve the above problem, the present inventor has conceived modes of the invention described below.

A semiconductor device according to the present invention is provided with a semiconductor substrate, a plurality of ferroelectric capacitors formed above the semiconductor device, and a plurality of first seal rings surrounding one or more selected from the plurality of ferroelectric capacitors.

In a manufacturing method of a semiconductor device according to the present invention, after a plurality of ferroelectric capacitors are formed above a semiconductor substrate, a plurality of seal rings surrounding one or more selected from the plurality of ferroelectric capacitors are formed.

DETAILED DESCRIPTION OF THE PREFERRED EMBODIMENTS

Figure 1:
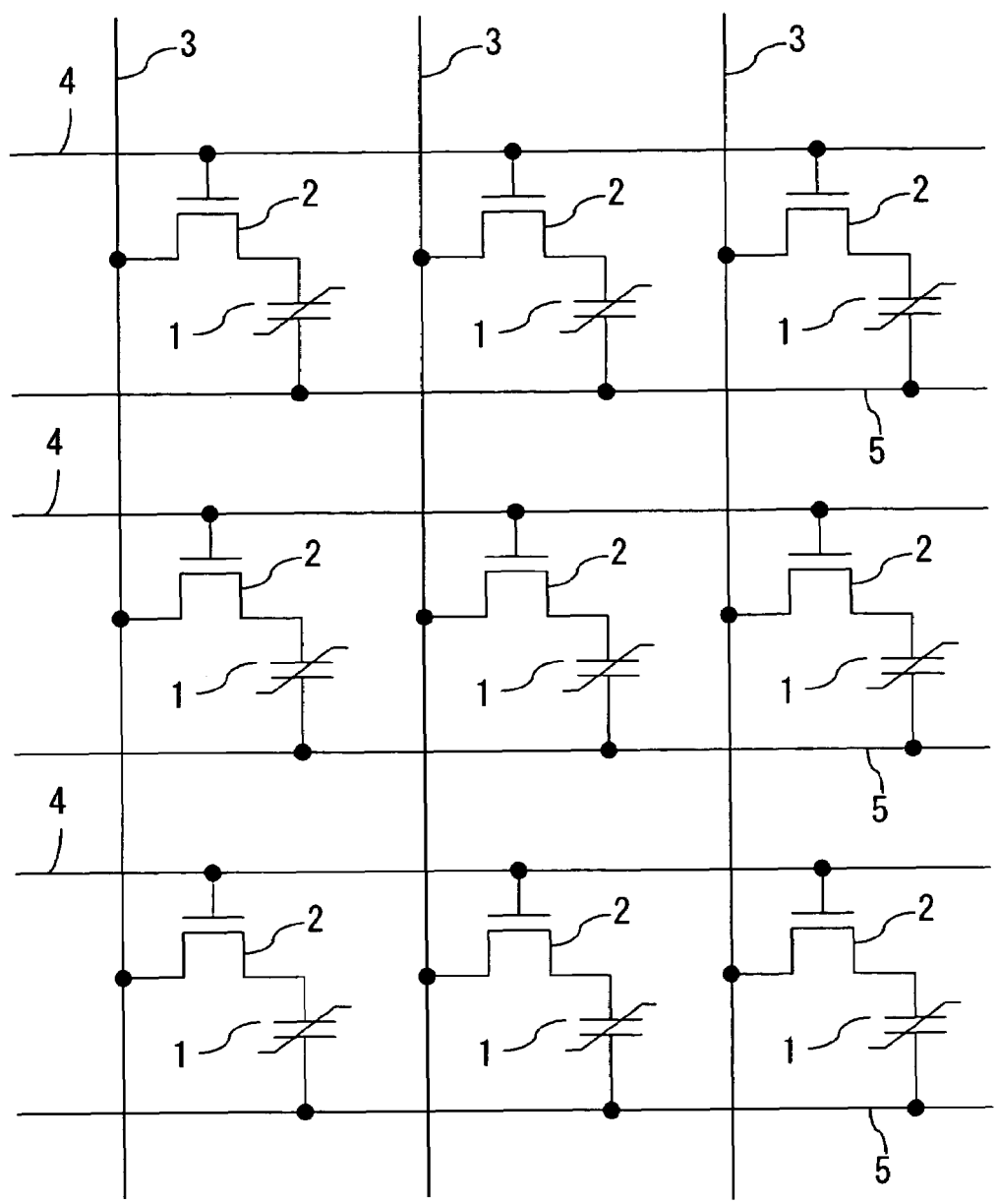
FIG. 1 is a circuit diagram showing a configuration of a memory cell array of a ferroelectric memory (semiconductor device) to be manufactured by a method according to an embodiment of the present invention.

Hereinafter, an embodiment of the present invention will be described concretely with reference to the attached drawings. FIG. 1 is a circuit diagram showing a configuration of a memory cell array of a ferroelectric memory (semiconductor device) to be manufactured by a method according to an embodiment of the present invention.

This memory cell array is provided with a plurality of bit lines 3 extending in one direction, and a plurality of word lines 4 and plate lines 5 extending in a direction perpendicular to the direction in which the bit lines 3 extend. Additionally, a plurality of memory cells of ferroelectric memories are arranged in an array in a manner to align with lattices constituted with these bit lines 3, word lines 4 and plate lines 5. Each memory cell is provided with a ferroelectric capacitor 1 and a MOS transistor 2.

A gate of the MOS transistor 2 is connected to the word line 4. One of the source/drain of the MOS transistor 2 is connected to the bit line 3 and the other source/drain is connected to one of the electrodes of the ferroelectric capacitor 1. The other electrode of the ferroelectric capacitor 1 is connected to the plate line 5. The respective word lines 4 and the plate lines 5 are shared by a plurality of MOS transistors 2 arranged in the same direction as the direction in which the word lines 4 and the plate lines 5 extend. Similarly, the respective bit lines 3 are shared by the plurality of MOS transistors 2 arranged in the same direction as the direction in which the bit lines 3 extend. The direction in which the word lines 4 and the plate lines 5 extend and the direction in which the bit lines 3 extend may be referred to as a row direction and a column direction, respectively.

In the memory cell array of the ferroelectric memory configured as above, data is stored in response to a polarization state of a ferroelectric film provided in the ferroelectric capacitor 1.

Next, a manufacturing method of a ferroelectric memory (a semiconductor device) according to the embodiment of the present invention will be described. It should be noted that a cross-sectional structure of each memory cell will be described together with a manufacturing method thereof for the sake of convenience. FIG. 2A to FIG. 2G are cross-sectional views showing the manufacturing method of a ferroelectric memory according to the embodiment of the present invention step by step. FIG. 3 is a layout view showing a relation between the ferroelectric capacitor and each seal ring in the ferroelectric memory according to the embodiment of the present invention.

Figure 2A:
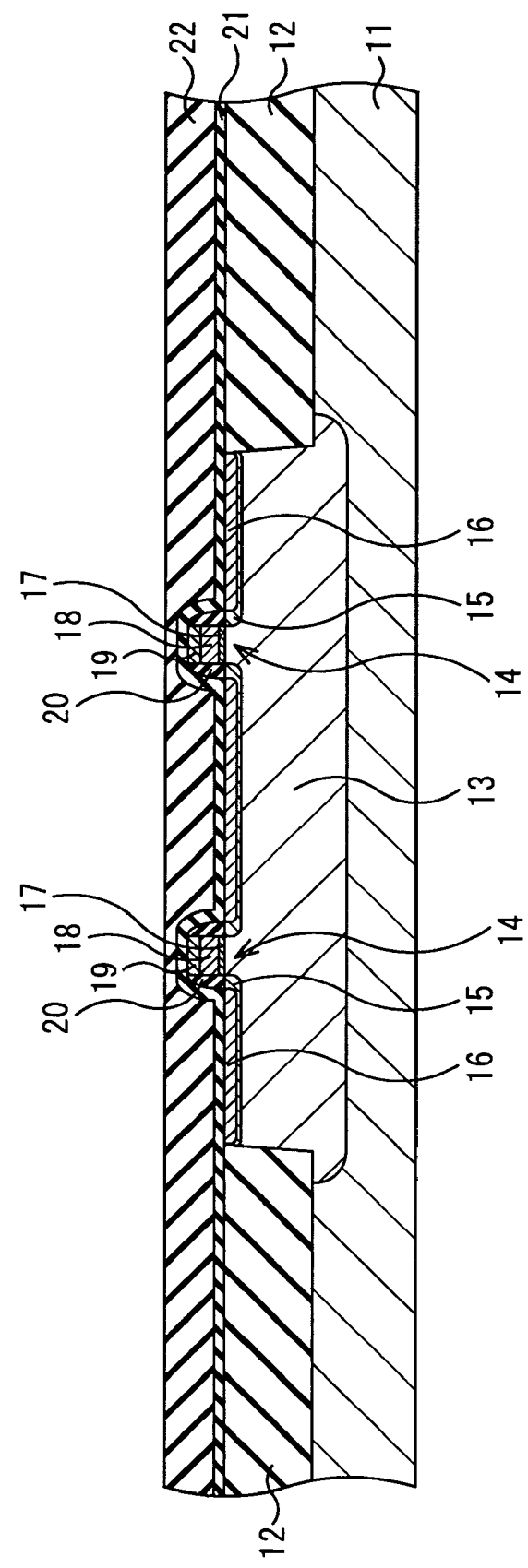
FIG. 2A is a cross-sectional view showing a manufacturing method of a ferroelectric memory according to the embodiment of the present invention step by step.
Figure 3:
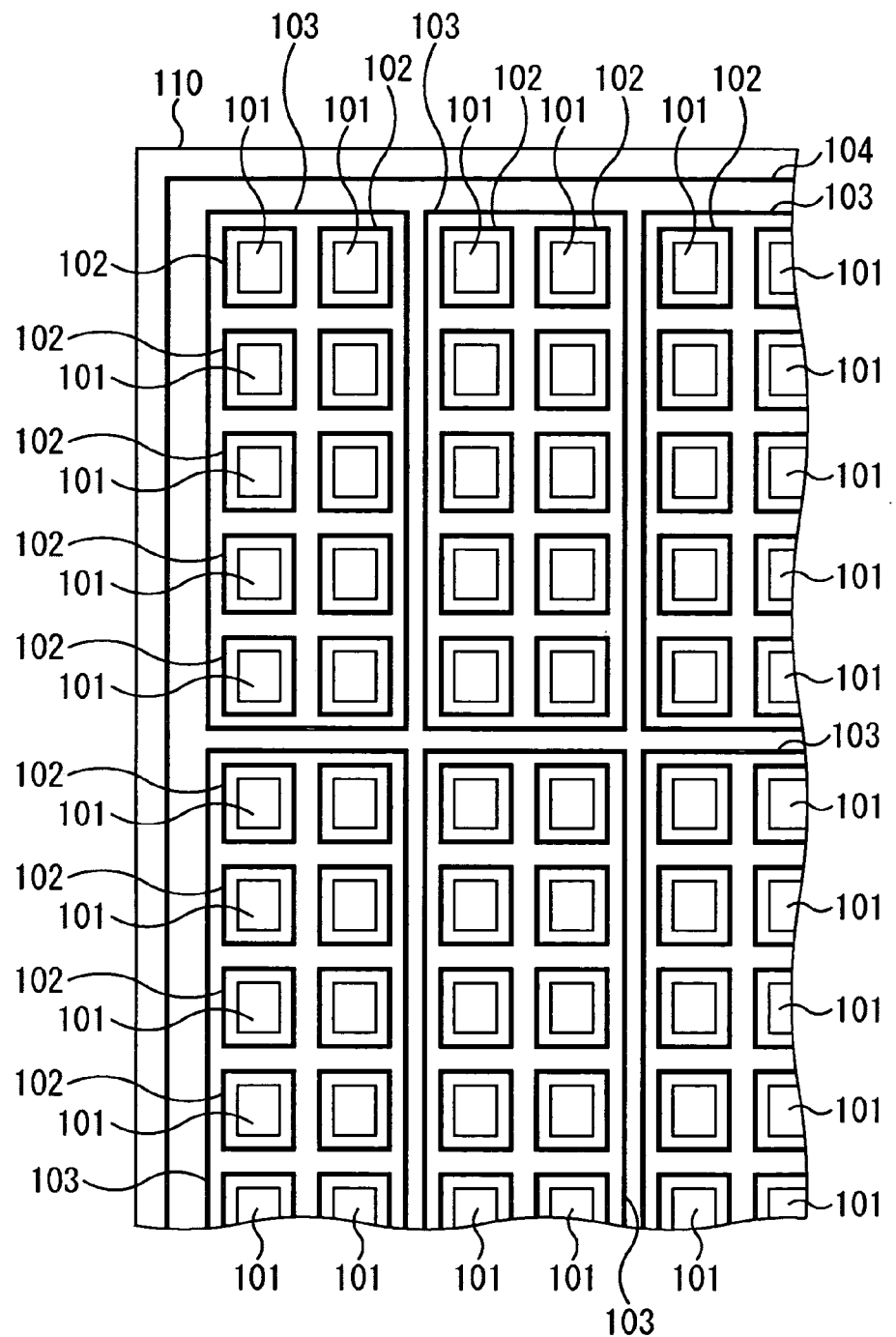
FIG. 3 is a layout view showing a relation between a ferroelectric capacitor and each seal ring in a ferroelectric memory according to the embodiment of the present invention.

First, as shown in FIG. 2A, an element isolation region 12 is formed on a surface of a semiconductor substrate 11 of a silicon substrate or the like by STI (Shallow Trench Isolation), for example. Next, in an element active region defined by the element isolation region 12, a well 13 is formed on the surface of the semiconductor substrate 11. Subsequently, by forming a gate insulating film 17, a gate electrode 18, a silicide layer 19, source/drain diffusion layers 15, a sidewall 20 and a silicide layer 16 on a surface of the well 13, a MOS transistor 14 is formed. This MOS transistor 14 is equivalent to the MOS transistor 2 in FIG. 1. Two source/drain diffusion layers 15 are formed in each MOS transistor, one of which is shared between two MOS transistors 14.

Next, a silicon oxynitride film 21 is formed on the entire surface in a manner to cover the MOS transistors 14, and further a silicon oxide film 22 is formed on the entire surface by an organic CVD method, for example. The silicon oxynitride film 21 is formed to prevent hydrogen-induced degradation of the gate insulating film 17 and the like at the time of formation of the silicon oxide film 22.

Figure 2B:
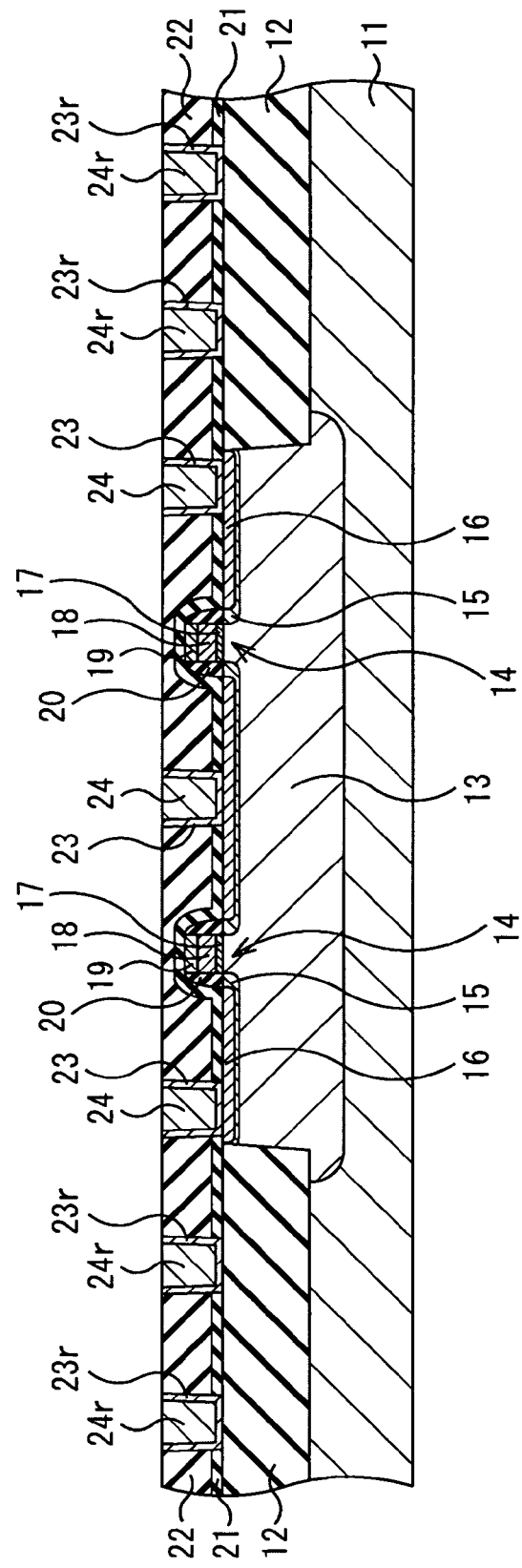
FIG. 2B is a cross-sectional view, continued from FIG. 2A, showing the manufacturing method of a ferroelectric memory according to the embodiment of the present invention step by step.

Subsequently, as shown in FIG. 2B, a plug contact portion is opened by forming a contact hole reaching each silicide layer 16 in the silicon oxide film 22 and the silicon oxynitride film 21. Then, after a stacked film made of a TiN film of 50 nm and a Ti film of 30 nm is formed in the contact hole as a glue film 23, a W film is filled by, for example, a CVD method, and CMP (Chemical Mechanical Polishing) is performed for planarization, so that a W plug 24 is formed. After the planarization is completed, a surface of the silicon oxide film 22 (interlayer insulating film) is slightly nitrified by plasma using $NH_3$ gas.

Above the semiconductor substrate 11, there are a plurality of individual capacitor regions in each of which a ferroelectric capacitor is to be formed later, and these individual capacitor regions are defined into a plurality of groups to define capacitor blocks, and seal holes reaching the element isolation region 12 are formed in a periphery of each individual capacitor region and a periphery of each capacitor block, along with formation of the contact hole for the W plug 24. Further, along with formation of the glue film 23 and the W plug 24, a glue film 23r and a W film 24r are formed in the seal hole. It should be noted that the seal hole is strictly formed in a manner to reach the element isolation region 12, and is not formed in the element active region in which the MOS transistor 14 and the like exist.

Figure 2C:
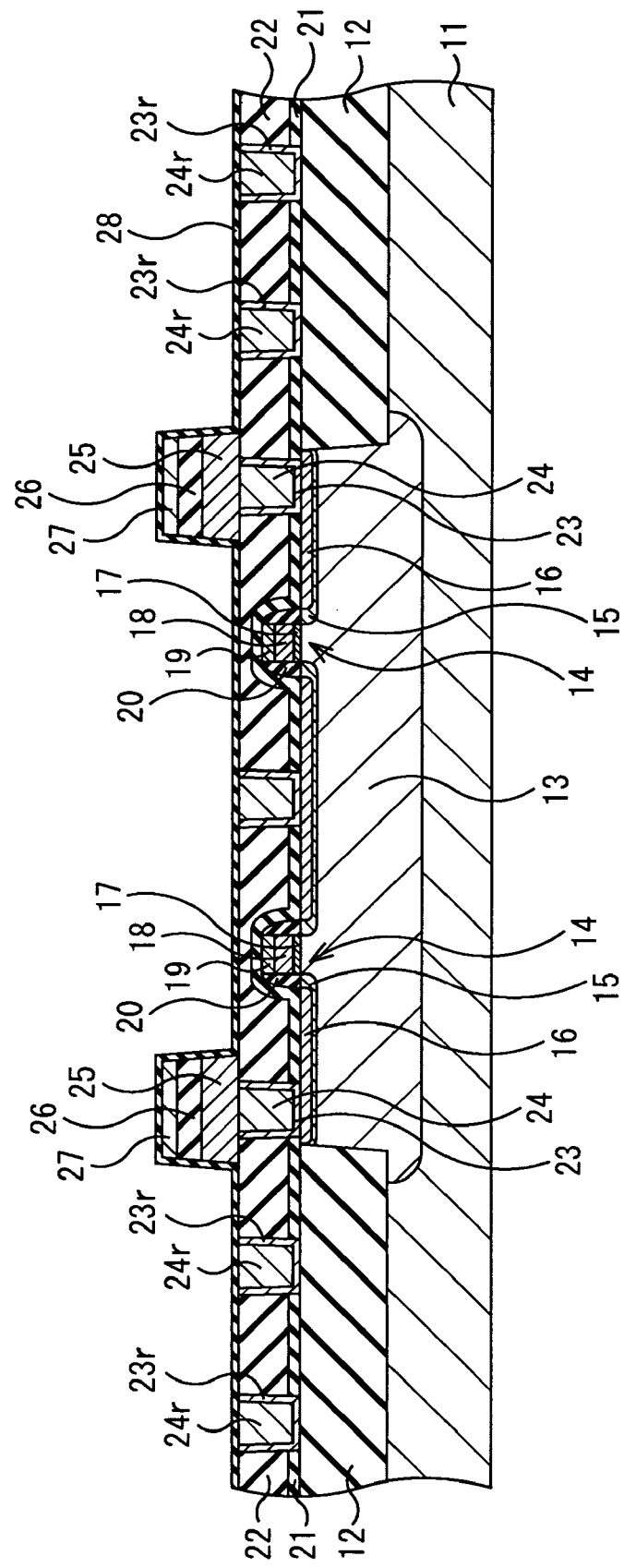
FIG. 2C is a cross-sectional view, continued from FIG. 2B, showing the manufacturing method of a ferroelectric memory according to the embodiment of the present invention step by step.

Next, as shown in FIG. 2C, a bottom electrode film 25, a ferroelectric film 26 and a top electrode film 27 are sequentially formed on the entire surface. In forming the bottom electrode film 25, a Ti film of 10 nm in thickness and an Ir film of 150 nm in thickness, for example, are sequentially formed by a sputtering method. As the ferroelectric film 26, a PZT film, for example, can be formed by an MOCVD method, a thickness thereof being 120 nm, for example. In forming the top electrode film 27, after an $IrO_x$ film is formed, annealing in a furnace is performed and subsequently an $IrO_2$ film is formed. The $IrO_x$ film and the $IrO_2$ film are formed by a sputtering method, for example.

The annealing performed after the formation of the $IrO_x$ film is recovering annealing to recover damage of the ferroelectric film 26 due to the formation of the $IrO_x$ film. As this recovering annealing, furnace annealing of 550° C. in $O_2$ atmosphere is performed for 60 minutes, for example.

Subsequently, by processing the top electrode film 27, the ferroelectric film 26 and the bottom electrode film 25 using patterning and etching technology, the top electrode film 27 is made to be a top electrode and the bottom electrode film 25 is made to be a bottom electrode, so that a ferroelectric capacitor of a stack structure in which the ferroelectric film 26 is sandwiched between the top electrode and the bottom electrode is formed. This ferroelectric capacitor is equivalent to the ferroelectric capacitor 1 in FIG. 1. In this processing, with a stacked film (not shown) of a plasma TEOS (Tetraethyl Orthosilicate) film and a TiN film, for example, being used as a hard mask, the top electrode film 27, the ferroelectric film 26 and the bottom electrode film 25 are etched collectively.

Next, an alumina protective film 28 covering the ferroelectric capacitor is formed on the entire surface. The alumina protective film 28 is formed by a CVD method, for example, a thickness thereof being 5 to 20 nm, for example, and being 10 nm in the present embodiment. Step coverage of the alumina protective film 28 is satisfactory. Subsequently, by performing furnace annealing of 550° C. in $O_2$ atmosphere for 60 minutes, etching damage generated in the ferroelectric film 26 is recovered.

Figure 2D:
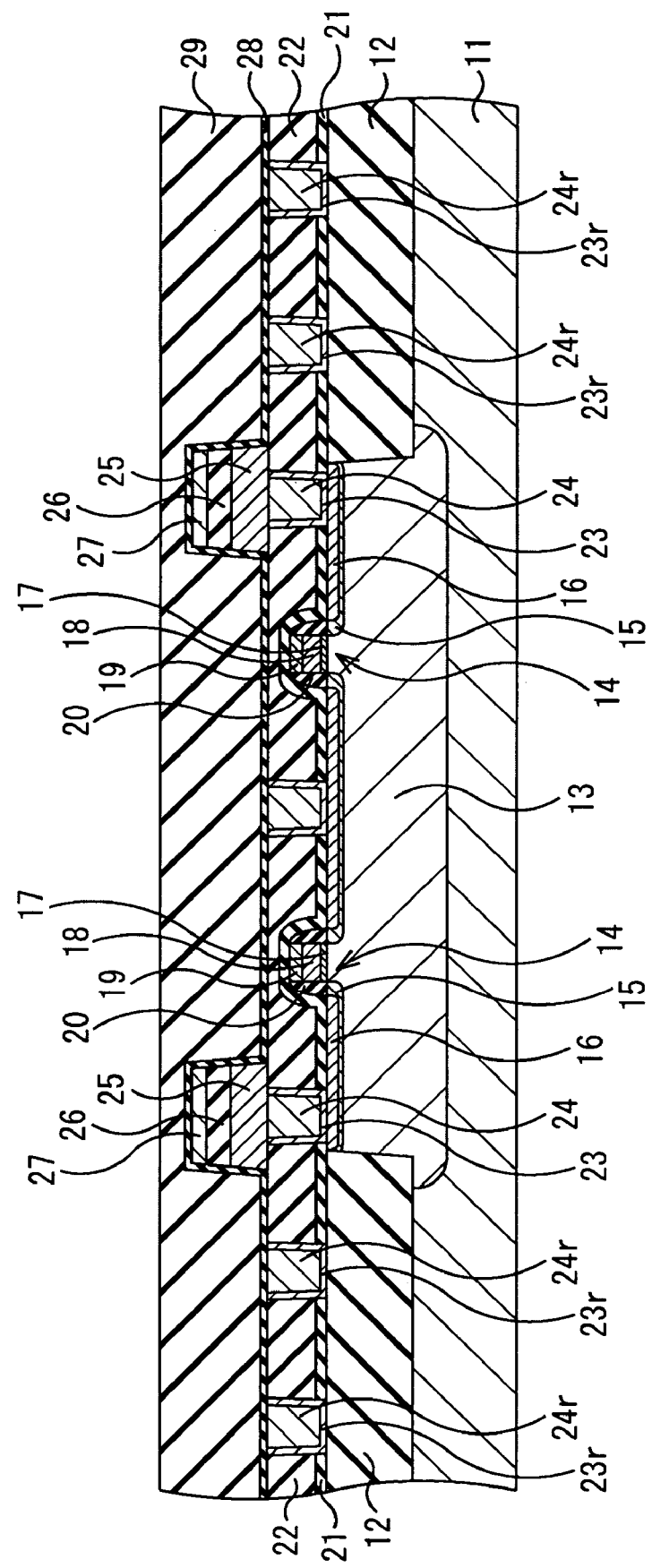
FIG. 2D is a cross-sectional view, continued from FIG. 2C, showing the manufacturing method of a ferroelectric memory according to the embodiment of the present invention step by step.

Next, as shown in FIG. 2D, after an interlayer insulating film 29 is formed on the entire surface, the interlayer insulating film 29 is planarized by CMP. As the interlayer insulating film 29, a silicon oxide film, for example, is formed. A remaining film thickness after CMP is 400 nm on the top electrode 27, for example.

Figure 2E:
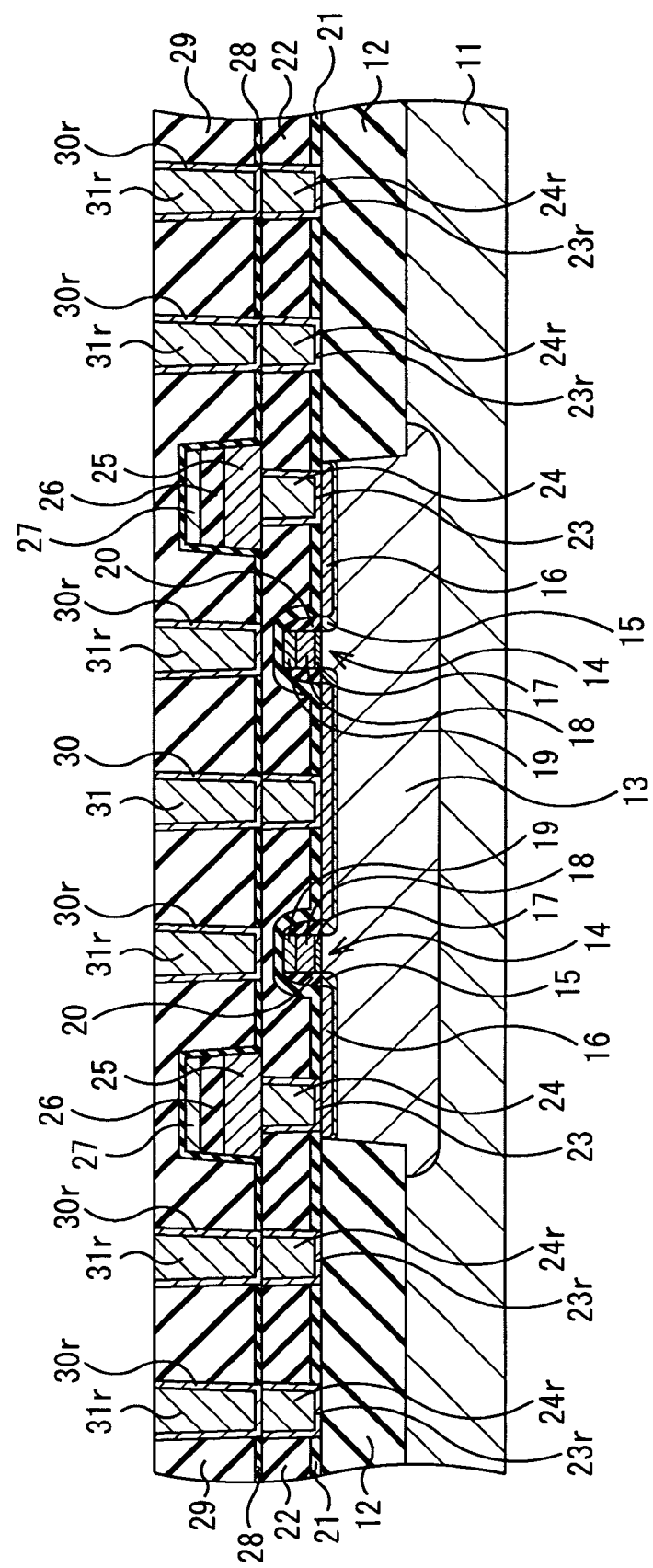
FIG. 2E is a cross-sectional view, continued from FIG. 2D, showing the manufacturing method of a ferroelectric memory according to the embodiment of the present invention step by step.

Subsequently, as shown in FIG. 2E, a contact hole is formed which reaches the W plug 24 connected to the silicide layer 16 shared by two MOS transistors 14, in the interlayer insulating film 29 and the alumina protective film 28, using patterning and etching technology. Next, after a TiN film of 50 nm, for example, is formed in this contact hole as a glue film 30, a W film is filled by the CVD method, for example, and planarized by performing CMP, so that a W plug 31 is formed. Subsequently, surfaces of the interlayer insulating film 29 and the W plug 31 are exposed to $N_2$ plasma at 350° C., for example. Time for this plasma processing is 120 seconds, for example.

Meanwhile, along with formation of the contact hole for the W plug 31, seal holes reaching the W film 24r or the silicon oxide film 22 are formed in the periphery of each individual capacitor region and the periphery of each capacitor block. Further, along with formation of the glue film 30 and the W plug 31, a glue film 30r and a W film 31r are formed in the seal hole. The seal hole is not formed in a region in which a wiring is to be formed.

Figure 2F:
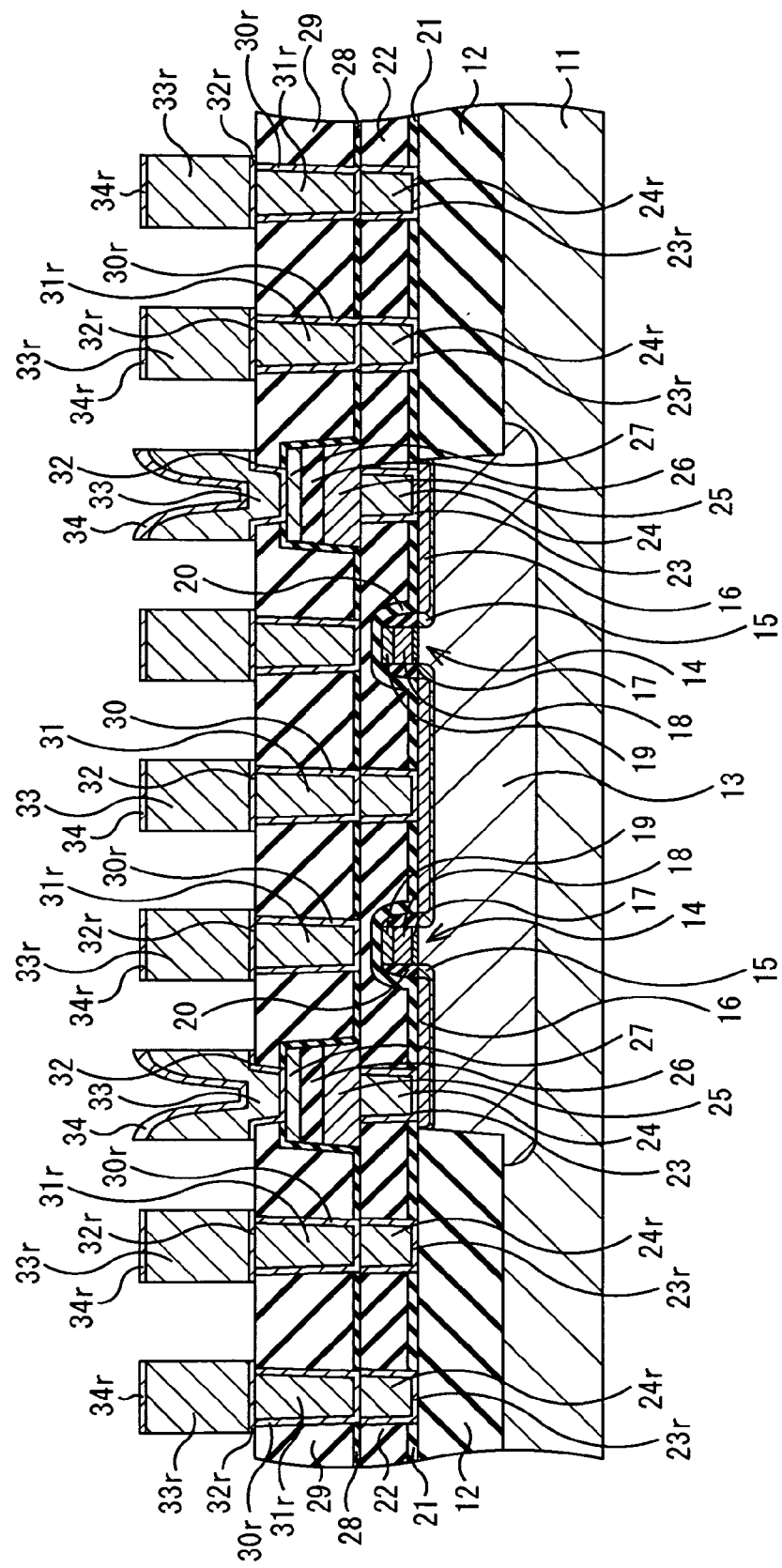
FIG. 2F is a cross-sectional view, continued from FIG. 2E, showing the manufacturing method of a ferroelectric memory according to the embodiment of the present invention step by step.

Next, a W oxidation preventing film (not shown) is formed on the entire surface. As the W oxidation preventing film, a SiON film, for example, can be used, a thickness thereof being about 100 nm, for example. Then, as shown in FIG. 2F, a contact hole reaching the top electrode film 27 and a contact hole (not shown) reaching the bottom electrode film 25 are formed in the W oxidation preventing film and the interlayer insulating film 29, using patterning and etching technology. Subsequently, there is performed annealing for recovering damage due to hydrogen at the time of stacking of the interlayer insulating film 29 and damage due to etching. This annealing may be furnace annealing of 550° C. in $O_2$ atmosphere, for example, the time thereof being 60 minutes, for example. After this annealing, the W oxidation preventing film is removed by etch-back.

Next, a glue film, a wiring material film and a glue film are sequentially deposited. As the lower glue film, a stacked film of a TiN film of 70 nm and a Ti film of 5 nm in thickness, for example, is formed, as the wiring material film, an Al—Cu alloy film of 400 nm in thickness, for example, is formed, and as the upper glue film, a stacked film of a TiN film of 30 nm and a Ti film of 60 nm in thickness, for example, is formed.

Next, an antireflection film (not shown) is formed on the upper glue film by means of application, and further a resist is applied. Subsequently, the resist film is processed so as to align with a wiring pattern, and with the resist film after the processing being a mask, the antireflection film, the upper glue film, the wiring material film and the lower glue film are etched. As the antireflection film, a SiON film, for example, is formed, a thickness thereof being about 30 nm, for example. By such etching, as shown in FIG. 2F, a glue film 32, a wiring 33 and a glue film 34 electrically connected to the W plug 31 and/or the top electrode film 27 are formed, and a glue film 32r, a metal film 33r and a glue film 34r are formed above the W film 31r.

Figure 2G:
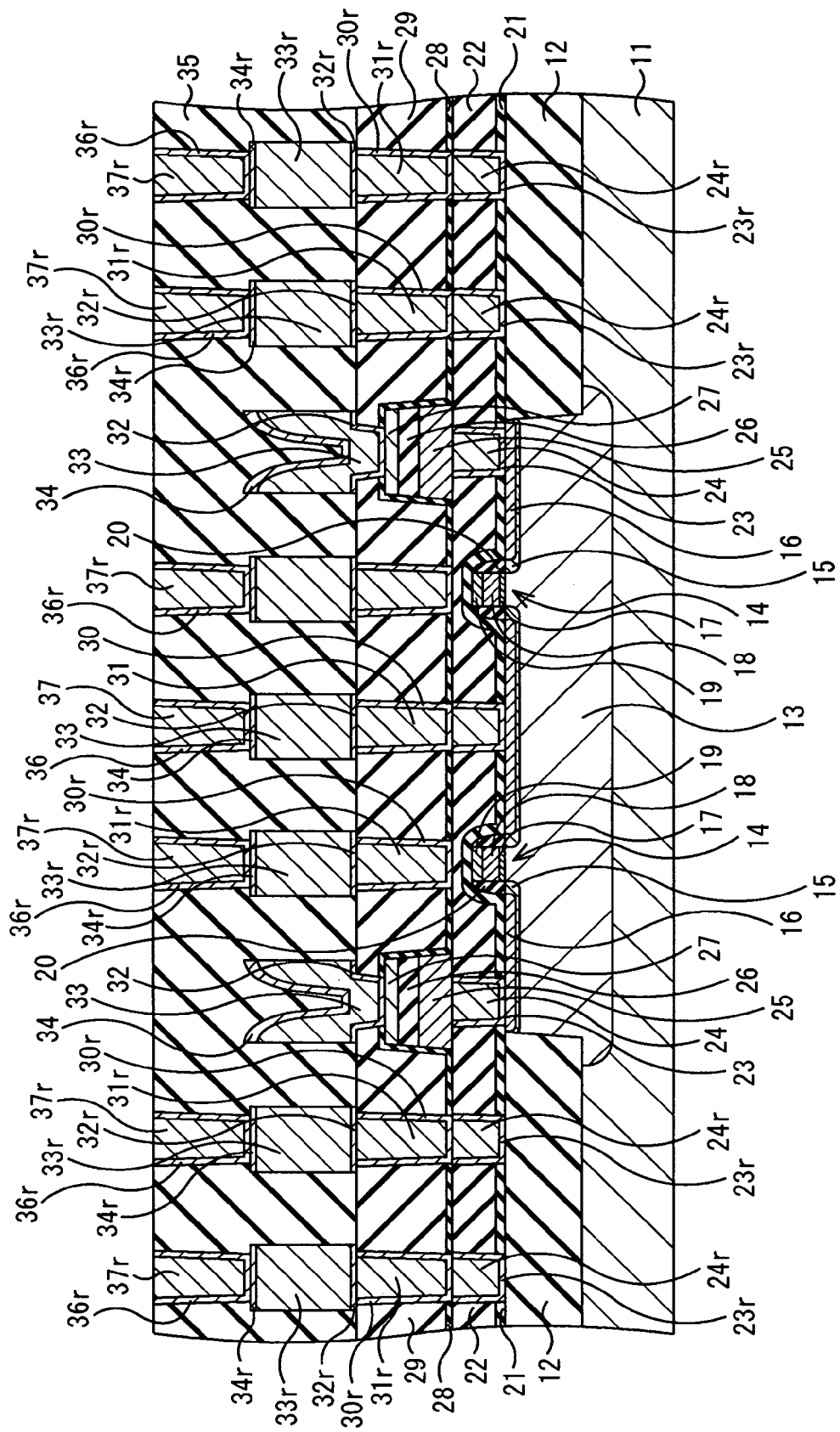
FIG. 2G is a cross-sectional view, continued from FIG. 2F, showing the manufacturing method of a ferroelectric memory according to the embodiment of the present invention step by step.

Subsequently, as shown in FIG. 2G, after an interlayer insulating film 35 is formed on the entire surface, the interlayer insulating film 35 is planarized by CMP. As the inter layer insulating film 35, a silicon oxide film, for example, is formed. Subsequently, a contact hole reaching the glue film 34 is formed in the interlayer insulating film 35, using patterning and etching technology. Next, after a TiN film of 50 nm, for example, is formed in this contact hole as a glue film 36, a W film is filled, for example, by the CVD method and planarized by performing CMP, so that a W plug 37 is formed.

Meanwhile, along with formation of the contact hole for the W plug 37, seal holes reaching the glue film 34r are formed in the periphery of each individual capacitor region and the periphery of each capacitor block. Further, along with formation of the glue film 36 and the W plug 37, a glue film 36r and a W film 37r are formed in the seal hole. The seal hole is not formed in the region in which the wiring is to be formed.

Subsequently, a wiring, an interlayer insulating film and the like being further upper layers are formed. Then, a cover film made of a TEOS oxide film and a SiN film, for example, is formed, so that a ferroelectric memory having a ferroelectric capacitor is completed. In forming the upper wiring, the wiring 33 connected to the top electrode film 27 is made connected to the plate line, and the wiring 33 connected to the silicide layer 16 shared by the two MOS transistors 14 is made connected to the bit line, for example. As for the gate electrode 18, the gate electrode 18 itself may be the word line, or the gate electrode 18 may be connected to the word line in the upper wiring.

Meanwhile, the glue films 23r, 30r, 32r, 34r and 36r, and the W films 24r, 31r, 33r and 37r are unconnected to the element formed on the semiconductor substrate 11, but are parts of the seal ring.

In the ferroelectric memory according to the present embodiment manufactured as above, as shown in FIG. 3, a seal ring (first seal ring) 102 is formed in a manner to surround each ferroelectric capacitor 101 (equivalent to the ferroelectric capacitor 1 in FIG. 1), a seal ring (second seal ring) 103 is formed in a manner to surround, for example, ten ferroelectric capacitor 101, and further, a seal ring (third seal ring) 104 is formed in a manner to surround all of the ferroelectric capacitors 101 and along a dicing line 110 inside the dicing line 110.

Therefore, by the seal ring 104, moisture absorption from the outside is restrained, and by the seal rings 102 and 103, moisture discharged from the interlayer insulating film of the inside is restrained from being diffused to the ferroelectric capacitor 101. As a consequence, deterioration of the ferroelectric capacitor 101 due to moisture absorption is restrained.

In manufacturing the ferroelectric memory as above, it is only necessary that a pattern such as a reticle pattern used in manufacturing a conventional ferroelectric capacitor is altered, and an increase of the number of process steps is not particularly required.

In a conventional structure, in order to restrain deterioration of a ferroelectric capacitor due to moisture discharged from an interlayer insulating film, it is necessary to reduce moisture contained in the interlayer insulating film. However, when the film is formed in a high power effective to reduce moisture, damage to the ferroelectric capacitor already formed occurs. In contrast, in the present embodiment, deterioration of the ferroelectric capacitor can be restrained even without reducing moisture in the interlayer insulating film to the conventional level, so that occurrence of the damage described above can be avoided.

Incidentally, though triple seal rings are provided in the above embodiment, the seal ring 102 or 103, for example, is not necessarily required to be provided. When the seal ring 102 is not provided, the seal ring 103 is equivalent to the first seal ring and the seal ring 104 is equivalent to the second seal ring in claims. When the seal ring 103 is not provided, the seal ring 102 is equivalent to the first seal ring and the seal ring 104 is equivalent to the second seal ring in claims. Meanwhile, more multiple seal rings may be provided.

Incidentally, though the seal ring is not necessarily required to extend to a lower layer than the ferroelectric capacitor, it is preferable that the seal ring extends to the element isolation region in order to obtain higher moisture resistance.

Further, a material to constitute the seal ring is not restricted as long as the material can prevent diffusion of moisture. It is preferable to use a metal material, for example.

INDUSTRIAL APPLICABILITY

As described in detail above, according to the present invention, moisture can be restrained from permeating to a ferroelectric capacitor from a film such as an interlayer insulating film existing in a periphery of the ferroelectric capacitor. Therefore, deterioration of performance of the ferroelectric capacitor can be restrained.

What is claimed is:

1. A semiconductor device comprising:
   a semiconductor substrate;
   a plurality of ferroelectric capacitors formed above said semiconductor substrate;
   a plurality of first seal rings comprising metal films formed in the same layer as a layer of said ferroelectric capacitor, wherein, when seen from a direction vertical to a surface of said semiconductor substrate, each of said first seal rings surrounds only a corresponding one of said plurality of ferroelectric capacitors, and each of said first seal rings and the corresponding one of said plurality of ferroelectric capacitors form one memory cell, and
   a second seal ring surrounding two or more first seal rings selected from the plurality of said first seal rings.

2. The semiconductor device according to claim 1, wherein said second seal ring is formed along a dicing line.

3. The semiconductor device according to claim 1, further comprising:
   a plurality of second seal rings surrounding two or more first seal rings selected from the plurality of said first seal rings; and
   a third seal ring surrounding all of said plurality of ferroelectric capacitors and surrounding all of said second seal rings.

4. The semiconductor device according to claim 3, wherein said third seal ring is formed along a dicing line.

5. The semiconductor device according to claim 3, wherein said third seal ring comprises metal films formed in the same layer as a layer of said ferroelectric capacitor and in a layer upper than said ferroelectric capacitor.

6. The semiconductor device according to claim 5, wherein said third seal ring further comprises a metal film formed in a layer lower than said ferroelectric capacitor.

7. The semiconductor device according to claim 3, further comprising a plurality of wiring layers, wherein said third seal ring extends to the same height as a height of said wiring layer located uppermost among said plurality of wiring layers.

8. The semiconductor device according to claim 1, wherein said first seal ring comprises metal films formed in a layer upper than said ferroelectric capacitor.

9. The semiconductor device according to claim 8, wherein said first seal ring further comprises a metal film formed in a layer lower than said ferroelectric capacitor.

10. The semiconductor device according to claim 1, wherein said second seal ring comprises metal films formed in the same layer as a layer of said ferroelectric capacitor and in a layer upper than said ferroelectric capacitor.

11. The semiconductor device according to claim 10, wherein said second seal ring further comprises a metal film formed in a layer lower than said ferroelectric capacitor.

12. The semiconductor device according to claim 1, further comprising a plurality of wiring layers, wherein said second seal ring extends to the same height as a height of said wiring layer located uppermost among said plurality of wiring layers.

13. A semiconductor device comprising:
a semiconductor substrate;
a plurality of ferroelectric capacitors formed above said semiconductor substrate;
a plurality of first seal rings comprising metal films formed in the same layer as a layer of said ferroelectric capacitor, wherein, when seen from a direction vertical to a surface of said semiconductor substrate, each of said first seal rings surrounds only a corresponding one of said plurality of ferroelectric capacitors, and each of said first seal rings and the corresponding one of said plurality of ferroelectric capacitors form one memory cell; and
a plurality of wiring layers, wherein said first seal ring extends to the same height as a height of the wiring layer located uppermost among said plurality of wiring layers.

14. A manufacturing method of a semiconductor device, comprising:
forming a plurality of ferroelectric capacitors above a semiconductor substrate; and
forming a plurality of first seal rings comprising metal films formed in the same layer as a layer of said ferroelectric capacitor, wherein, when seen from a direction vertical to a surface of said semiconductor substrate, each of said first seal rings surrounds only a corresponding one of said plurality of ferroelectric capacitors, and each of said first seal rings and the corresponding one of the plurality of ferroelectric capacitors form one memory cell, wherein, in said forming the first seal ring, a second seal ring surrounding two or more first seal rings selected from the plurality of the first seal rings are formed along with the first seal rings.

15. The manufacturing method of a semiconductor device according to claim 14, wherein, in said forming the first seal ring, a plurality of second seal rings surrounding two or more first seal rings selected from the plurality of the first seal rings, and a third seal ring surrounding all of the plurality of ferroelectric capacitors and surrounding all of the second seal rings are formed along with the first seal rings.

16. The manufacturing method of a semiconductor device according to claim 14, wherein said forming the first seal ring comprises forming a plurality of metal films in the same layer as a layer of the ferroelectric capacitor and in a layer upper than the ferroelectric capacitor.

17. The manufacturing method of a semiconductor device according to claim 14, further comprising forming a plurality of wiring layers, wherein the first seal ring is extended to the same height as a height of the wiring layer located uppermost among the plurality of wiring layers.

18. The manufacturing method of a semiconductor device according to claim 14, further comprising:
before said forming the ferroelectric capacitor, forming a metal film connected to at least a part of the first seal ring above the semiconductor substrate.

19. A semiconductor device comprising:
a semiconductor substrate;
a plurality of ferroelectric capacitors formed above said semiconductor substrate;
a plurality of first seal rings comprising metal films formed in the same layer as a layer of said ferroelectric capacitor, wherein, when seen from a direction vertical to a surface of said semiconductor substrate, each of said first seal rings surrounds only a corresponding one of said plurality of ferroelectric capacitors, and each of said first seal rings and the corresponding one of said plurality of ferroelectric capacitors form one memory cell; and
a second seal ring surrounding two or more first seal rings selected from the plurality of said first seal rings,
wherein at least one selected from a group consisting of said plurality of first seal rings and said second seal ring extends to an element isolation region formed on the surface of said semiconductor substrate.

* * * * *